United States Patent [19]

Luettgenau

[11] Patent Number: 4,724,400
[45] Date of Patent: Feb. 9, 1988

[54] LINEAR AMPLIFIER ASSEMBLY

[75] Inventor: Georg G. Luettgenau, Manhattan Beach, Calif.

[73] Assignee: TRW Inc., Redondo Beach, Calif.

[21] Appl. No.: 40,973

[22] Filed: Apr. 21, 1987

[51] Int. Cl.$^4$ ............................ H03F 3/68; H03F 3/60
[52] U.S. Cl. .................................... 330/295; 330/286; 333/136
[58] Field of Search ............... 330/53, 56, 124 R, 286, 330/295; 333/125, 127, 136, 137

[56] References Cited

U.S. PATENT DOCUMENTS

| | | | |
|---|---|---|---|
| 4,234,854 | 11/1980 | Schellenberg et al. | 330/286 |
| 4,371,845 | 2/1983 | Pitzalis | 330/277 |
| 4,424,496 | 1/1984 | Nichols et al. | 330/286 |
| 4,598,254 | 7/1986 | Saito et al. | 330/286 |
| 4,641,106 | 2/1987 | Belohoubek et al. | 330/286 |
| 4,641,107 | 2/1987 | Kalokitis | 330/286 |
| 4,647,869 | 3/1987 | Kaneko et al. | 330/286 |

Primary Examiner—Eugene R. LaRoche
Assistant Examiner—Steven J. Mottola
Attorney, Agent, or Firm—Ronald M. Goldman; Sol L. Goldstein

[57] ABSTRACT

An RF power splitter-combiner for use in an amplifier system of the kind requiring both RF power splitting and RF power combining, comprising: RF splitter means containing a top and bottom wall, splitter input means centrally located therein and a plurality of splitter output means, said plurality of splitter output means being spaced a predetermined radial distance from and evenly angularly spaced about said input means; RF combiner means, said combiner means having a top and bottom wall, a plurality of input means and an output means, said input means being spaced a predetermined radial distance from and evenly angularly space about said output means; said splitter means containing an internal chamber and having a plurality of circular ridges and channels located in said splitter chamber concentric of said splitter input means; said combiner means containing an internal chamber and a plurality of circular ridges and channels located in said combiner chamber concentric of said combiner output means; said ridges and channels of said combiner means being of a different physical size and axial radial position than said ridges and channels of said splitter means; said splitter means and said combiner means located in overlying relationship; said splitter means having one of said splitter means top and bottom walls integral with one of said combiner top and bottom walls.

17 Claims, 15 Drawing Figures

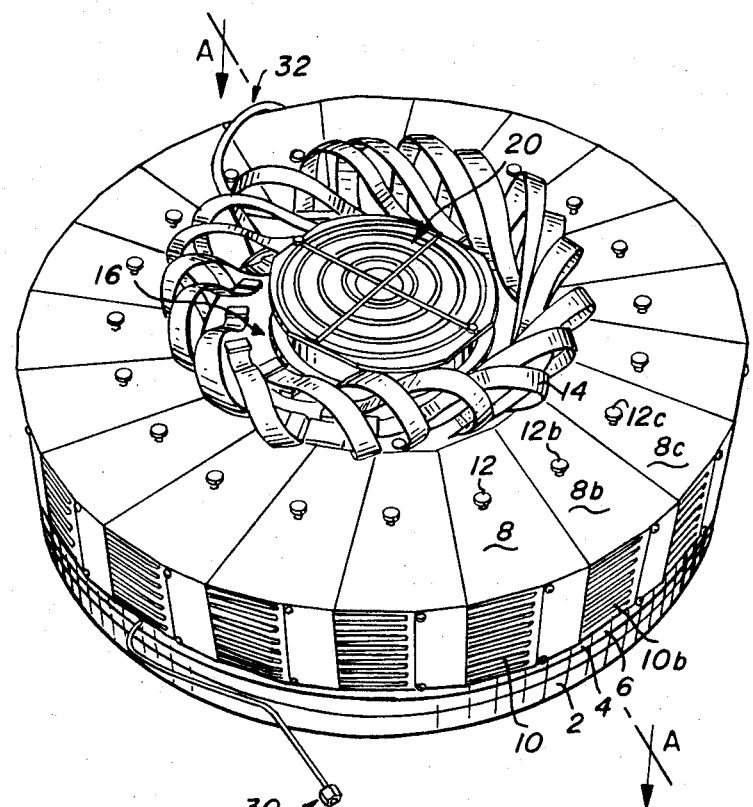
Fig_1
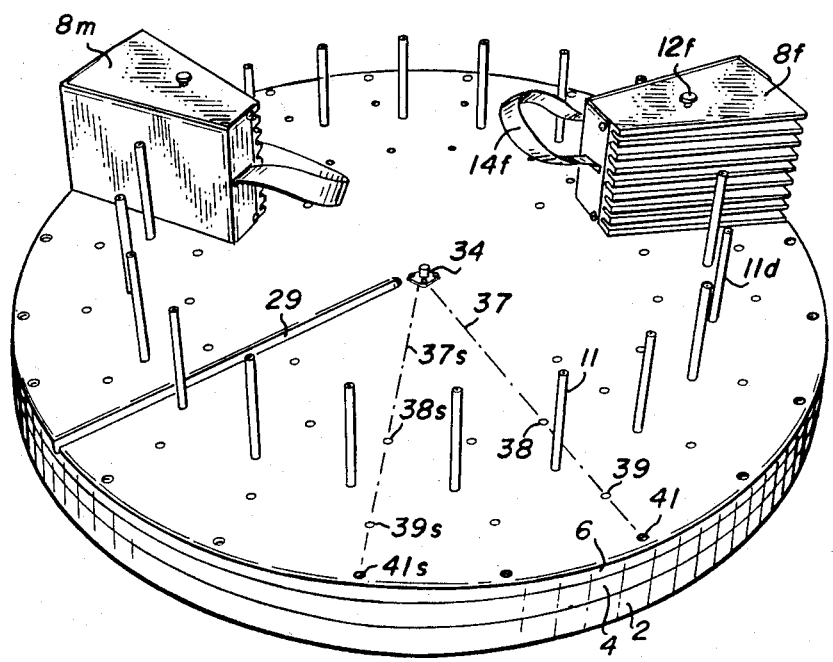
Fig_2

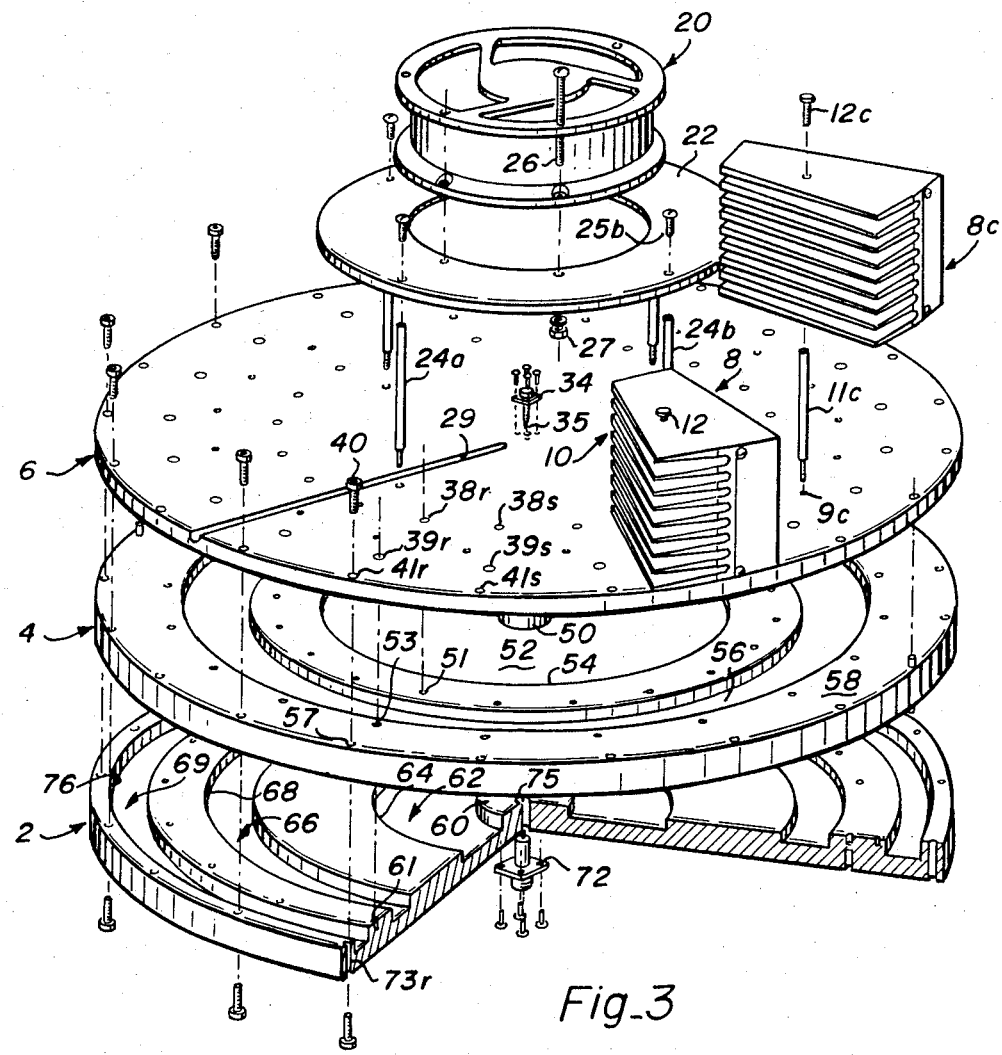
Fig_3
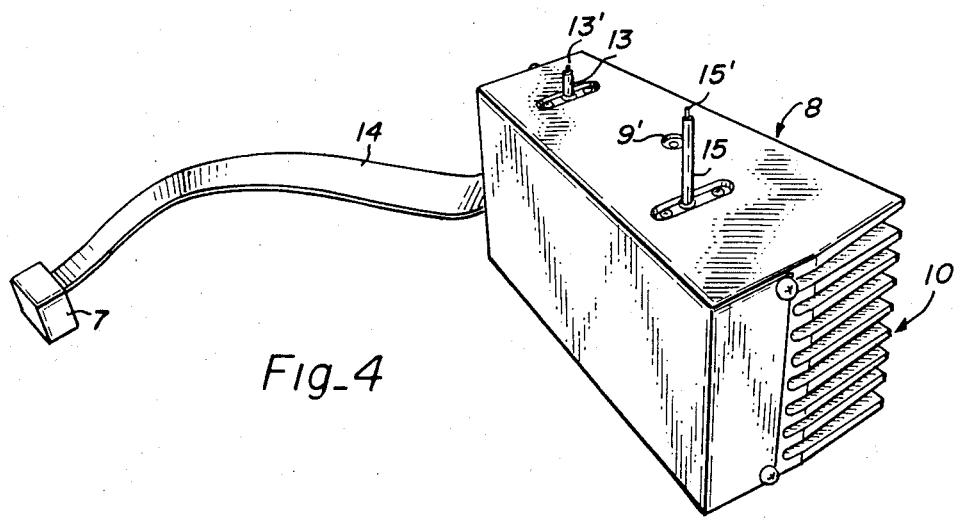
Fig_4

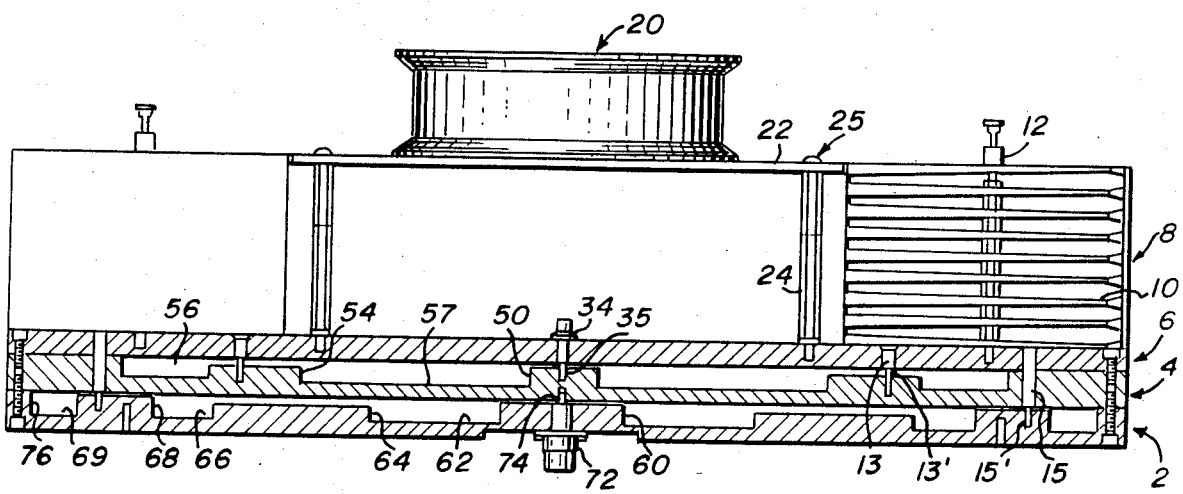
Fig_5a
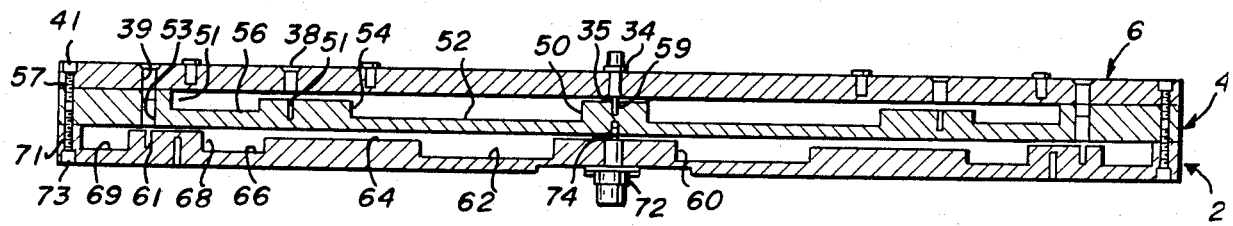
Fig_5b
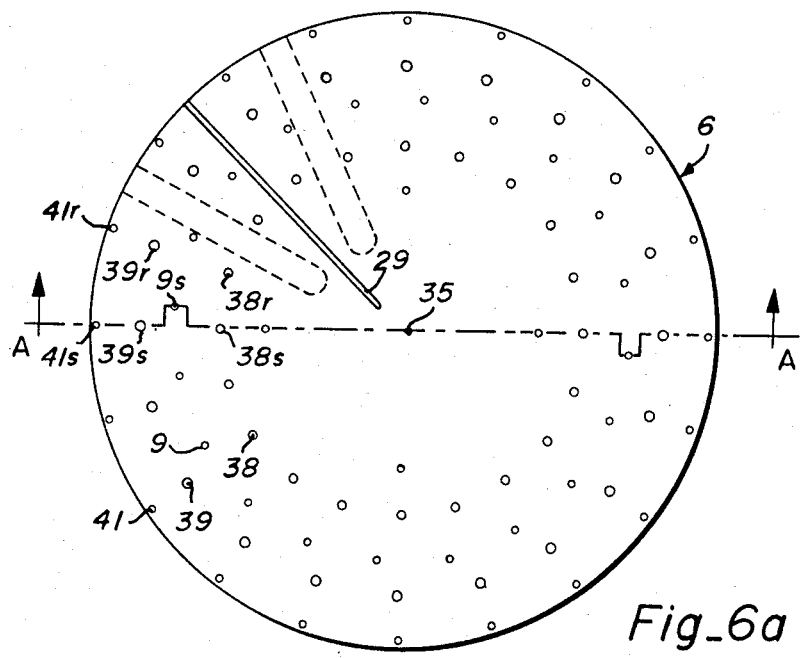
Fig_6a
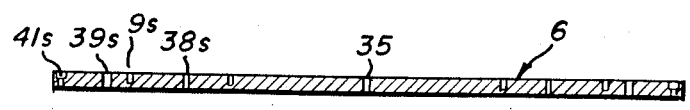
Fig_6b

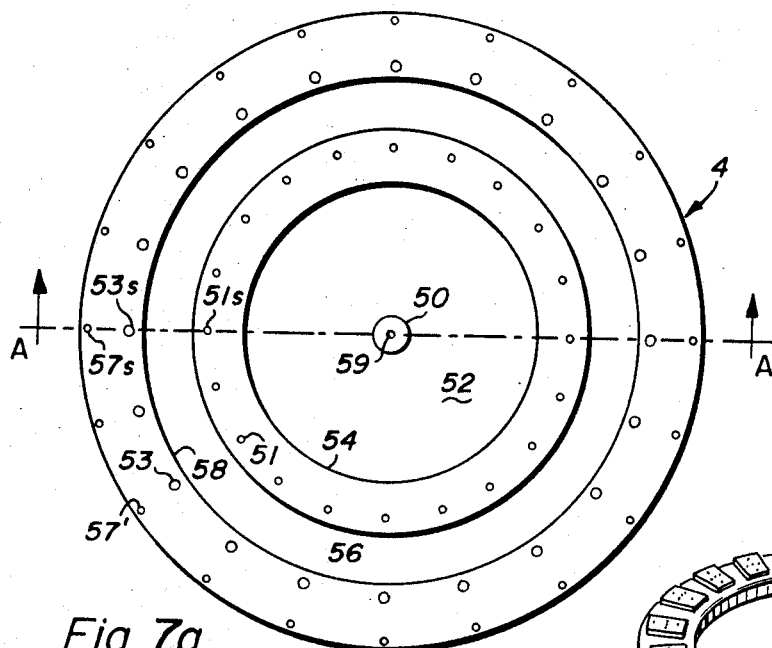
Fig_7a
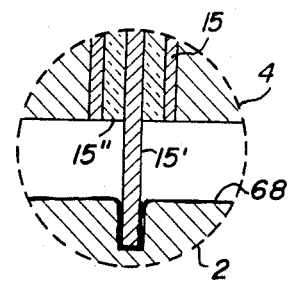
Fig_9
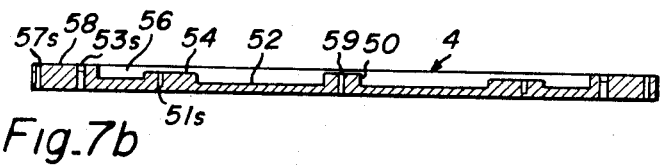
Fig_7b
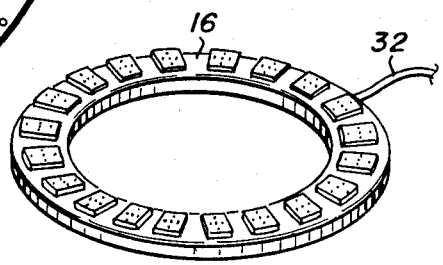
Fig_10
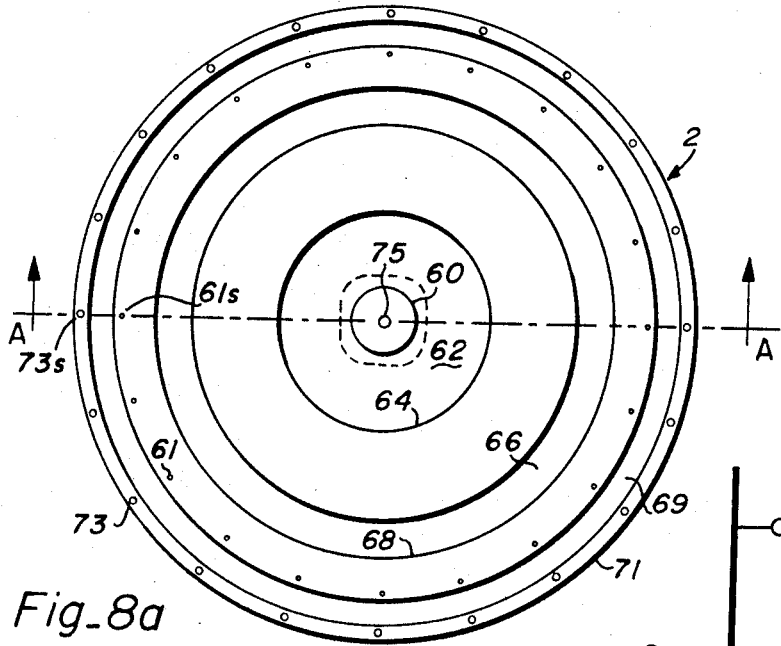
Fig_8a
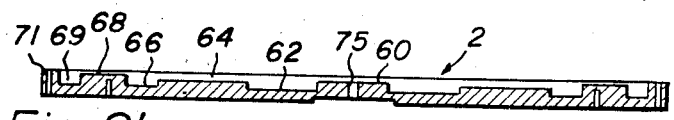
Fig_8b
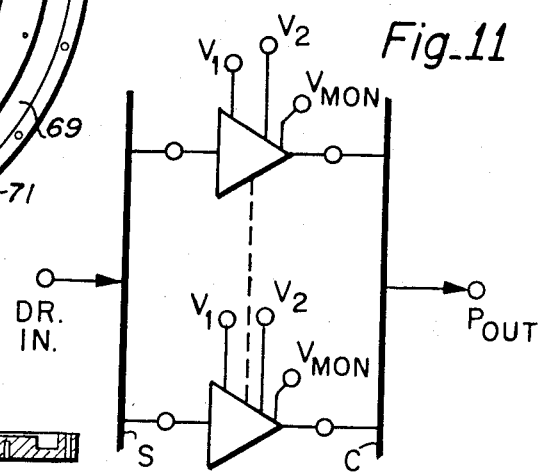
Fig_11

LINEAR AMPLIFIER ASSEMBLY

FIELD OF THE INVENTION

This invention relates to linear RF amplifiers and associated power-combiner splitters and, more particularly, relates to an improved high power solid state linear amplifier assembly useful in UHF cellular telephone communication systems.

BACKGROUND

High power linear RF amplifiers are known devices that have heretofore been used in signaling systems requiring broad bandwidth operation. Such amplifiers find application in many fields, including the cellular telephone communications systems which employ ultra high frequency RF for communications transmissions.

In such systems, the linear amplifier processes a number of different communications channels simultaneously. For example, a current band of UHF frequency operation used in multi-cellular telephone systems is 870 through 890 MHz. That frequency range or band is divided into many separate bands or "channels", each of which carries the carrier and modulation information associated with a single cellular phone user, as assigned by the telephone station equipment at the time the user places a call on the cellular phone. Within the described UHF band, typically, at least 16 or more separate channels are provided. Because of its low distortion characteristics, the linear amplifier is capable of amplifying simultaneously signals from all of the 16 or more channels without allowing telephone modulation signals from one channel to cause interference with the telephone modulation signals of another channel.

The prior linear amplifier assembly includes a plurality of semiconductor amplifiers, or amplifier modules as they are sometimes called, a power splitter and a power combiner. In such known assembly, the RF signal or signals to be amplified and which may consist of a plurality of separate Rf signals spaced apart in carrier frequency or channels, as previously described, is applied to the power splitter input. The power splitter divides the signal between the inputs of the plurality of semiconductor amplifier modules and a portion of the original input signal is amplified by each of the semiconductor amplifiers. The amplified signal from each amplifier is then applied as an output to a corresponding one of the multiple inputs of the power combiner. The power combiner in turn adds together or combines the individual RF signals inputted from the semiconductor amplifiers into a single output signal of a high power level; one that is amplified in level from the signal level applied to the input at the splitter and providing a RF power gain. The combiner output is then transmitted to other system equipment, not relevant to the present subject.

The requirement for multiple numbers of semiconductor amplifier modules in such linear amplifier assemblies is due to technological limitations existing in present day semiconductor amplifiers. No single known reasonably priced semiconductor amplifier is capable of operating at the high power levels and frequencies required in such communications systems; typically power levels of 300 watts average and over 1 kilowatt peak power in frequency ranges of between 870 and 896 MHz. This limitation is even more pronounced at frequencies beyond the UHF range and extending in the microwave frequency regions, those above 1 GHz, all of which may be employed with linear amplifiers as described.

Semiconductor amplifier modules for such systems are available from many sources including those offered as model ABC-900-60 by the RF Devices Division, TRW, Inc. of Lawndale, Calif., U.S.A. Those semiconductor amplifier modules find application in the present invention as well as in the prior art linear amplifier assemblies as becomes more apparent in subsequent portions of this specification.

In the prior art linear amplifier assembly described, reference was made to a power splitter and a power combiner. As those skilled in the art appreciate, these are essentially the same devices; the device is more typically referred to as a combiner-splitter. The same component is used in one mode to divide an input signal into a plurality of output signals and is referred to by its "splitting" mode of operation. Conversely, when multiple input signals are applied to those multiple terminals, previously referred to as the splitter output, the signals are additively combined at the output, previously referred to as the splitter input, and, hence, the component functions as a "combiner".

In the linear amplifier combination, the RF characteristics of the splitter and the combiner must be essentially the same, particularly, bandwidth, phase delay and impedance characteristics as well as other electrical characteristics as is known to those skilled in this art. To insure such compatability of those RF characteristics, the prior designs used the easiest, most reliable and cost effective approach: they used the same combiner-splitter structure in both instances; one splitter-combiner functioning in the system as the splitter and the other splitter-combiner functioning in the system as the combiner. As becomes apparent from the description hereinafter, the present invention departs from that practice in achieving a novel and effective assembly.

One particularly useful form of splitter-combiner used in a linear amplifier system is a radial splitter-combiner, and, particularly, a radial wave guide splitter-combiner. That known component is of a geometry of a circular disk in which there is centrally located on one side coaxially of the disk an electrical connector, such as a coax connector, and further includes a plurality of individual secondary connectors, the exact number being dependent on the number needed in the particular system, sixteen in the specific system example given, evenly angularly spaced at a given radial distance from the center of the disk. The secondary coaxial connectors may be located on one side or the other side of the disk as the designer's choice. Within the metal walls defining the disk like shape, there is included a chamber and a series of ridges and grooves or channels of ring-like circular shape is formed concentrically about the central axis of the element. As is known to those skilled in the art, the width and height of the ridges and the depth of the channels as well as the spacing between the edges of the ridge and the opposed wall surfaces within the internal chamber serve to define the electrical transmission characteristics of the combiner-splitter. An electrical probe extending from the center coaxial connector is electromagnetically coupled to the within chamber as are the conductors associated with each of the plurality of the perphierally located secondary connectors.

When used as a splitter in such systems, the RF signal applied to the center conductor is radially propagated internally to all of the outer located secondary connectors and is, hence, divided between them so that a portion of the input signal appears at each of the output connectors. Conversely when used as a combiner, the RF signals from a plurality of sources is applied to respective ones of the outer secondary connectors and each signal radially propagates within the chamber inwardly toward the center connector. The arrangement is such that the multiple signals arrive at the center probe location in phase so that the separate signals are added or combined. The RF signal outputted from the center connector is thus a combined or higher power signal.

Although the prior linear RF amplifier assemblies constructed according to the conventional practice performs the function very well and is electrically very efficient, it is nonetheless mechanically cumbersome and requires many expensive components, such as cables and connectors. For example, in a system that required the use of 16 semiconductor amplifier modules, a radial wave combiner and a radial wave splitter, there were approximately 32 pieces of coaxial cable and approximately 128 coaxial connectors. Further each of the two splitter-combiners require a total of two circular metal plates, at least one of which is machined to close tolerances in order to attain the necessary structure. The bulky and complex mechanical arrangement is exemplified by the depiction appearing in an advertising brochure handed out by MMD Company in which a linear RF amplifier assembly made by the Microwave Modules and Devices, Inc. Company is illustrated. More cumbersome yet is the RF linear amplifier assembly produced prior to the invention by TRW, Inc. at its Bordeaux, France facilities. The present invention reduces the number of expensive parts, including the elimination of coaxial cables of extended length and associated connectors, and reduces the number of expensive machined parts required in such assembly.

In normal operation, semiconductor amplifiers generate heat as an undesirable side effect of the amplifiers amplification function. If the temperature at which the semiconductor operates becomes elevated, the life of the semiconductor is shortened. If that temperature rises to a level well beyond the specification or limits of the semiconductor, the heat destroys it entirely. Thus, the semiconductor amplifiers include heat sinks and heat fins, extended metal vanes, typically of aluminum, through which heat generated in the semiconductor material during operation is conducted externally to the ambient assisting to maintain the operational temperature of the semiconductor within specification. A further element thus included in conventional linear amplifier systems as well as in the present invention is a cooling system, such as a fan or the like which circulates air, for cooling the heat sensitive electronic components. In conventional systems, the cooling arrangement adds to the cumbersomeness and mechanical complexity. Typically the system includes a fan for drawing air across the heat fins and exhausting that air in a different direction; the movement of air serving to more rapidly and effectively transfer away or dissipate the generated heat.

SUMMARY OF THE INVENTION

The present invention provides a new assembly in a linear amplifier arrangement. An object of the invention is to provide a more efficient mechanical package for a linear RF amplifier assembly. A further object of the invention is to reduce the number of parts necessary to produce the combiner-splitter elements of the linear RF amplifier combination. More specifically, an object is to reduce the amount of cable extensions, the number of electrical connectors and the number of machine parts so as to reduce the cost manufacture, enhance the ease of assembly and increase the reliability of RF linear amplifier devices.

Briefly, the improvement to the linear amplifier combination aforedescribed includes a novel splitter-combiner in which the the RF power combiner, which is of a disk like geometry, is sandwiched together with the RF power splitter, of like geometry, into a single pancake like sandwich; and the splitter and the combiner share a common metal wall. One side surface of the common wall forms an inside surface of the splitter and the other side surface of the common wall forms an inside surface of the combiner. The invention is further characterized by the supporting of the semiconductor amplifier modules on the top or upper surface of the splitter and combiner arrangement above described. The modules are arranged radially spaced about the periphery of the upper surface; short semi-rigid electrical conductor means connect an input of the semiconductor amplifiers through the metal walls of the disk to the splitter and additional semi-rigid conductor means connect the output of the amplifier means to the combiner. In an additional aspect of the invention, each of the amplifiers contains heat fins which are oriented radially outwardly from the axis of the combiner-splitter assembly with the major surfaces of the fins oriented essentially parallel to the upper surface; and a fan is located coaxial of said splitter-combiner arrangement, spaced from the upper surface of the combiner-splitter so as to cause air to flow radially of said axis through said heat fins, as well as to cause air to flow along the axis of the splitter-combiner.

The foregoing objects and advantages of the invention together with the structure characteristic thereof, which was only briefly summarized in the foregoing passages, becomes more apparent to those skilled in the art upon reading the detailed description of a preferred embodiment which follows in this specification, taken together with the illustration thereof presented in the accompanying drawings.

BRIEF DESCRIPTION OF THE DRAWINGS

In the drawings:

FIG. 1 is a perspective view of an embodiment of the linear amplifier assembly as viewed from the front top surface;

FIG. 2 is a perspective view of a portion of the embodiment of FIG. 1 with most amplifier modules and the fan elements removed, illustrating more clearly the novel combiner-splitter in perspective view;

FIG. 3 is an exploded view of a portion of the embodiment of FIG. 1;

FIG. 4 is a bottom perspective view of a semiconductor amplifier module used in the embodiment of FIG. 1;

FIG. 5a is a section view of the embodiment of FIG. 1 taken along the lines A—A;

FIG. 5b is a section view of the combiner-splitter of FIG. 3 and corresponds to the section view of FIG. 5a in which the amplifier modules and fan elements are omitted;

FIG. 6a is a top plan view of the upper plate used in the combiner-splitter of the invention and FIG. 6b is a section view thereof taken along the lines A—A in FIG. 6a;

FIG. 7a is a top plan view of the intermediate plate used in the splitter-combiner combination and FIG. 7b is a section view thereof taken along the lines A—A in FIG. 6a;

FIG. 8a is a top plan view of the bottom most plate used in the novel splitter-combiner combination and FIG. 8b is a section view thereof taken along the lines A—A in FIG. 8a;

FIG. 9 is a partial section view drawn to enlarged scale of one of the coaxial leads connected between the splitter-combiner and an amplifier module as taken from FIG. 5a;

FIG. 10 is a perspective view of a printed circuit board which forms the power distribution board used in the embodiment of FIG. 1; and FIG. 11 is an electrical schematic diagram of the embodiment of FIG. 1, illustrating input and output connections.

DETAILED DESCRIPTION OF A PREFERRED EMBODIMENT

A preferred embodiment of the invention is illustrated in a top perspective view in FIG. 1. As illustrated, the amplifier assembly presents a compact and efficient mechanical appearance of a generally short cylindrical shape of geometry suggestive of its desirable electrical qualities as well. The amplifier includes a base that consists of three metal disks or plates, the bottom most plate 2, an intermediate plate 4, and a top disk or plate 6, the exact nature of which is described hereafter in further detail. A series of semiconductor amplifier modules is located atop the surface of plate 6. This includes amplifier module 8 and nineteen additional like modules located about the periphery of the upper surface of plate 6. To avoid encumbering the drawing with unnecessary numerals for each module, the other modules are not numbered. However, they may be referred to by the same number, 8, together with an alphabetic letter; thus for twenty amplifieres, there is in addition to 8, 8b through 8t as counted counter clockwise from module 8 to FIG. 1. Should reference for any purpose thus be made to other amplifier modules, or dipicted in other figures, it is referred to in the text and/or identified in the figures as one of 8 through 8t.

Each of the amplifier modules includes heat fins 10 which are spaced apart parallel plates that as shown extend radially toward the center of the circular disk and is oriented parallel to the surface of the disk. A bolt 12 which extends through the heat fins fastens the wedged shaped module to the top plate 6. A fan 20 is centrally located on plate 6 and is supported by support members, not illustrated in this figure, above the plates surface. As shown, the fan is oriented coaxial with the major axis of the disk and directs air upwardly along the axis, sucking or drawing air through the heat fins and the passages formed, of grill like appearance, out the other end, not illustrated, and up along the axis. A power cable 14 of ribbon like geometry is connected to the amplifier module; the other end of the cable is connected by a connector, not illustrated, to a connector on a power circuit board 16. The power board is of an annular washer shape geometry and fits within the annular region defined between the end of the amplifier modules and the outer cylindrical walls enshrouding fan 20. A coaxial input connector 30 is provided which leads in through a groove in the upper surface of plate 6 under one of the air ducts formed in an amplifier module, specifically module 12Q, to the center input connector of the splitter, not illustrated in this figure. A power cord 32 is provided to connect power board 16 to appropriate voltages and monitoring equipment from an external source, not illustrated and which does not form part of this invention. The sandwich of metal plates 2, 4 and 6 in the lower portion of the figure defines a power splitter and a power combiner; those elements are oriented in a coaxial overlying relationship, coaxial with plate 6. As those skilled in the art appreciate, wave guide type splitters and combiners are known, although they have not heretofore been combined physically in the arrangement illustrated.

A closer view of the geometry of the splitter-combiner arrangement is presented in FIG. 2. In this view, the circular disk like nature or geometry of the plates is readily apparent. All but two of the amplifier modules have been removed to provide this illustration and amplifier modules 8T and 8N are the two illustrated.

A plurality of upstanding guideposts 11, only one of which is numbered, is mounted by means of a threaded end to a pole in plate 6. The upper end of the guideposts includes a threaded opening through which a bolt such as the bolt 12N, inserted and hand tightened to affix the amplifier module in place atop plate 6 and prevent it from moving laterally.

A microwave connector 34 is coaxially and centrally located in the plate. Connector 34 is suitably a coaxial type connector of the SNA type. A groove 29 extends along a radii to the edge of the surface. The groove serves as a channel in which to seat the semi-rigid coaxial cable earlier illustrated as cable 30 in FIG. 1.

A large number of openings are formed in the upper surface. Taking one set of openings or holes along radii 37 in the figure, there is shown a first opening or hole 38, a second hole or opening 39 radially spaced from the former, and a fourth hole 41. The first hole 38 serves as an input coupling passage for the amplifier module located at this position, the second opening serves as the output passage for the module and the outer opening 41 is for the inclusion of a bolt, which fastens the top plate to plate 4. As the reader may observe, if additional radial lines are drawn from the center of the top plate figure, the lines will intersect like series of openings, each of which is associated with a particular amplifier module. For purposes of this description, those additional openings are not all separately identified by a numeral.

The exploded view of FIG. 3 provides some assistance in understanding the mechanical nature of the assembly. For convenience of illustration, many of the amplifier modules are omitted. In addition, even though certain of the amplifier modules are illustrated, the associated power connector is not. In addition, the annular shaped printed circuit board, illustrated generally in FIG. 10, which contains the power supply connectors is also omitted.

As shown in the figure, fan 20 is supported atop an annular flange 22 and is fastened thereto by means of bolts 26 and nut 27 which extends through openings in the outer rims of the fan through an inner peripheral hole on flange 22. A series of at least three additional such bolt arrangements is used in the embodiment to complete fastening. In turn flange 22 is attached to the upper surface of plate 6 by means of posts or standoffs 24. The standoffs contain threaded bottom ends and are screwed into threaded openings in plate 6. The upper ends upon which the flange rests contains a threaded opening and a bolt is screwed through the passage fastening the flange to the standoff. At least three additional standoff posts are provided in the embodiment to assure a firm attachment. The standoffs elevate the fan's position above the surface of plate 6 by a distance approximately equal to the height of the amplifier module. Although not illustrated in this figure, the annular shaped power circuit board is normally seated atop flange 22 and, hence, the flange provides the additional function for that element. As shown in the figure, a plurality of bolts 41 fastens plate 6 to underlying plate 4, the latter of which contains threaded openings. In like manner, the lowermost plate 2 is fastened to plate 4 by means of bolts illustrated which extends through openings in the bottom plate, not illustrated, into threaded holes on the underside of plate 4. As becomes apparent from other views, the bottom side of plate 4 is generally flat as is the bottom side of plate 6.

Passage 38 in plate 6 is aligned with a smaller opening or hole 51 in plate 4 which serves as a feet for a center conductor of a coaxial transmission line receptacle as becomes more apparent from the discussion of the additional figures in this application. In like manner, passage 39 is aligned with another passage 53, extending through plate 4, and passage 53 is in turn axially aligned with passage 61 in the upper surface of the bottommost plate. As previously discussed, the passages, such as holes 38 and 39, are located along a radial line drawn from the center of the plate and, hence, the underlying holes or passages are similarly located along such a radii or are in the same radial plane. These aligned passages just identified and described are associated with a single one of the amplifier modules.

By drawing a radial line through any other of the pair of passages located at the same radial distance, the passages unnumbered associated with each of the other of the twenty amplifier modules used in this embodiment may be located. In as much as the passages associated with any one module, all serve the same purpose as the passages associated with any other of the modules, the description is limited to a single group or pair of openings discussed.

The upper surface of plate 4 contains a central raised cylindrical portion 50, an annular shaped depressed portion 52, a ridge 54 in which hole 51 and like holes are angularly spaced about, an annular channel 56 and a peripheral rim shaped ridge 58. As those skilled in the art recognize, the combination of these depressions and ridges and the flat upper surface of cover plate 6 form a wave guide type combiner-splitter structure and specifically a radial wave type combiner-splitter arrangement. In the combination, this structure is used specifically as a splitter.

Bottom plate 2 includes a central circular ridge 60, an annular channel 52 surrounding the ridge, a rim shaped ridge 54 bordering channel 52, a ring shaped channel 66, a ridge 68, a further peripheral channel 69 and an upstanding ridge 71. As those skilled in the art recognize, the combination of these ridges and channels in the upper surface of plate 2 in combination with the flat bottom surface of intermediate plate 4 defines a power splitter-combiner of the wave guide type and specifically a radial wave splitter combiner. In this embodiment, the structure is used specifically as a power combiner.

The embodiment contains two combiner-splitters which are of a different structure as is readily apparent from this view. However, the two elements are designed to have equivalent electrical characteristics, be "matched", as is reasonably possible, as becomes more apparent from the description of the operation of the novel amplifier assembly. An output connector 72 suitably a SNA type connector is inserted coaxially within the passage in ridge 60 in the bottommost plate and serves as a path for outputting RF energy. Mounting brackets may be included, but are not illustrated and are not necessary to an understanding of the invention. From the preceding figures, it is apparent that the combiner-splitter combination is formed in a cylindrical shape much like a stack of pancakes.

Reference is now made to FIG. 4 which illustrates in perspective view one of the amplifier modules as viewed from the underside. As illustrated, an extending semi-rigid coaxial line or lead 13 extends upwardly at right angles to the base. A second upstanding coaxial lead 15 radially aligned with and spaced from the first extends upwardly from the housing base by a greater distance. Each coaxial lead contains a hollow cylindrical outer conductor and a center conductor coaxial therewithin, 13' and 15' illustrated, and a cylindrical fill or sleeve of dielectric insulating material suitably "Teflon", fits in the space between the two conductors, providing electrical insulation therebetween. As shown in each of the leads, the center conductor is slightly greater in length than the associated outer conductor. As those skilled in the art recognize, the coaxial conductor arrangement is a semi-rigid coaxial transmission line cable useful to transmit RF energies, such as UHF and/or microwave frequencies, and the extending tip of the center conductor, 3' and 15', which extends beyond the edge of the hollow cylindrical outer conductor, acts as an RF energy emitting and receiving probe, depending upon the application. As becomes more apparent, hereafter, the connecting power cable and the passage for the guide posts are illustrated. The description of the other elements all of which have been earlier described or are elsewhere herein described and the description is not here repeated.

The amplifier module contains internally a conventional solid state amplifier the details of which are not necessary to an understanding of the invention. Specifically, the solid state amplifier is of conventional structure and employs a flat printed circuit board upon which are mounted a suitable number of transistors and other elements of electrical components that serve the function of amplifying RF signals applied at an input to a higher level of signal at an output. Ideally in this linear amplifier combination, all of the solid state amplifiers so described have the same amplification characteristics for best results. A cover member serves to protect the internal components from damage during handling or from dust and dirt which might accumulate in use and modify the electrical characteristics of the amplifier as well as to prevent a view of the amplifier details.

Semiconductor RF amplifier modules presently available on the marketplace can be used in this combination. By way of specific example, the semiconductor RF amplifier available from the RF Devices Division of the company TRW, Inc., which was referred to in the background of this specification, was employed. In that connection, some of the mechanical aspects of that off the shelf device, was modified to fit the requirements of the arrangement described in this specification. Specifically the TRW amplifier module is made available in the form of a thin rectangular box like geometry and contains standard electrical connectors at its front and back end. This module can be fitted in any particular kind of housing, such as the heat fin arrangement presented in this specification and illustrated in the drawings, including FIG. 4 which is essentially of a wedge shape. The standard connectors accompanying the semiconductor amplifier product were removed and replaced by the semi-rigid coaxially connectors illustrated in the previous figures.

Those skilled in the art appreciate the cost savings inherent in using an existing off the shelf design in the combination. It is recognized, however, that more expensive customized semiconductor amplifier modules may be designed and custom built, permitting a slightly different mechanical appearance to the modules from that employed in the illustrations of these drawings, or which incorporates improved circuitry or additional circuit features as may enhance the results available in the combination, all of which comes within the scope of the invention, however, because of the cost savings, the specific embodiment illustrated is preferred.

The foregoing description and illustrations are believed sufficient in detail as to enable one skilled in this art to construct, make and use this invention. However, to insure understanding even by readers of lesser skill, there is included the section views of FIGS. 5a and 5b to better illustrate the splitter and the combiner elements in assembled relationship and FIGS. 6 through 8 which illustrate the anodized aluminum plates comprising plates 2, 4, and 6, previously discussed from which the splitter and combiner are assembled. Thus FIG. 6a shows the top plate 6 from a top plan view and fully illustrates the symmetry of the arrangement of holes for mounting the amplifier's twenty discreet amplifier modules. An example, FIG. 6b illustrates a section of the plate in 6a taken along the section line A—A. FIG. 7a is a top plan view of the plate 4 which is the splitter in the described combination. The series of passages, cylindrical ridges and cylindrical channels is illustrated. FIG. 7b illustrates in section the view of FIG. 7a taken along the lines A—A. FIG. 8a is a top plan view of the upper surface of the bottommost plate specifically the "combiner" plate and FIG. 8b is a section thereof taken along the lines A—A.

Recognizing that labeling all of the holes in FIGS. 6 through 8 would encumber the drawings and complicate the understanding of the invention for clarity of illustration, only a few of the holes are labeled. Since all of the holes associated with an amplifier module are essentially identical with any other, the convention chosen is the same used for describing the amplifier module and the elements of the amplifier. That is taken counter clockwise from amplifier 8, which has associated holes 9, 38, 39 and 41, the holes are labeled with the same letter used to designate the amplifier. Thus, holes 9s, 38s, 39s and 41s are associated with amplifier module 8s.

FIG. 5a presents a partial section view of the embodiment of FIG. 1. In this view, the identification of the elements earlier identified by numeral is identified by the same numeral. The pancake like or stacked arrangement of the machined plates 2, 4 and 6 is better illustrated in this view. As is apparent, the series of ridges and depressions and the relative heights of those ridges and spacing from the adjacent flat surface define characteristics of a splitter-combiner of the radial wave type.

As shown, the structures are physically different. They are tailored to have the same frequency and impedance characteristics. Thus both the splitter-combiner formed between the intermediate surface and the upper plate, which in this combination is specifically employed as a splitter, should have the same RF characteristics, namely bandwidth and center frequency, with respect to RF energy as the splitter-combiner combination formed between the upper surface of the bottommost plate and the flat opposed surface of the intermediate plate. Thus although physically different and of the same outer diameter, the devices should exhibit the same essential bandwidth and center frequency characteristics. Although one mechanical arrangement is shown, there are other possibilities that fit within the invention, which through experiment and design, those skilled in the art, may if they choose, define and substitute in this combination.

As shown in the section view in FIGS. 5a and 5b, plate 4 is a common wall to both the splitter, formed between plate 6 and plate 4, and the latter intermediate plate defines a first enclosed chamber in the space between the upper surface of plate 4 and the lower surface of plate 6. Within that chamber plate 4 contains two ridges 50 and 54 that extend upwardly toward plate 6 and are spaced therefrom; ridge 50 is spaced a first predetermined distance, $d_1$, from the under surface of plate 6, the latter of which is essentially flat; and ridge 54 is spaced a distance, $d_2$, from the confronting surface. As illustrated the second spacing distance, $d_2$, is greater than the first gap or spacing, $d_1$. As better illustrated in FIG. 7a the ridges are of a cylindrical or circular geometry, as variously characterized, which are concentric about the center axis of the plate at opening 59.

Likewise viewing in FIGS. 5a, 5b and 7a, the channels formed between the ridges, the upper surface of plate 4 defines a channel 52 extending in a circle about the center or axis of plate 4, concentric with the aforedescribed ridges. A second channel 56 is located at a greater radial distance from the central opening 59 in plate 4 and extends thereabout in a circle concentric with the first mentioned channel. As shown a gap or space, $d_3$, is provided between the upper wall of the chamber formed by plate 6 and the bottom of channel 52; a gap or space, $d_4$, is provided between plate 6's undersurface and the bottom of channel 56. As illustrated the latter spacing, $d_4$, is less than the corresponding spacing, $d_3$, between the plate 6's undersurface and the bottom of the channel 52. The aforedescribed geometry and spacing is also illustrated in the plan view of FIG. 7a and the section view of FIG. 7b.

As further illustrated in FIGS. 5a and 5b and in FIGS. 8a and 8b, plate 4 also defines a second enclosed chamber, which serves as part of the combiner, in the space between the under surface of plate 4 and the upper surface of plate 2. Within that chamber, plate 2 contains the three ridges 60, 64, and 68, that are of cylindrical or circular geometry, extending upwardly toward plate 4. And these ridges are spaced from the plate by gaps, referred to as $d_5$, $d_6$, and $d_7$, respectively, with the spacing to the plate related as $d_6 > d_5 > d_7$, as that relationship is illustrated in the figures. As appears in FIG. 8b, the ridges form concentric circles coaxial of the plate's axis at opening 75. Likewise the three channels are of circular geometry arranged concentric with the axis and they are located at different radial distances from the center; channels 62, 66 and 69 as taken from the center outward toward the cylindrical end wall. As was the case in the splitter section structure, the channel bottoms are spaced from the undersurface of plate 4, which they confront, by distances that are designated $d_8$, $d_9$ and $d_{10}$. However, in this embodiment those distances are the same length; ie. $d_8=d_9=d_{10}$.

Turning again to FIG. 5b, passage 38 is shown to extend through plate 4 opening into the chamber formed in the body of the splitter. The hole or receptacle 51 in plate 4 is aligned with that passage. Moreover aligned holes 39 and 53 form a passage that extends from the upper side of plate 6 through plate 4, opening into the chamber formed in the body of the combiner. The passage by-passes the first chamber. The short hole or receptacle 61 in plate 2 is coaxial with the passage.

The section view of FIG. 5a illustrates more specifically the positioning of the connectors and input leads. Thus connector 34 which is shown along the center line of the plate contains a coaxial lead which extends through the passage in the upper plate and the center conductor 35 of that lead extends across the gap into the hole in the ridge and makes electrical contact therewith. As those skilled in the art recognize, the center lead serves to couple energy into the gap for radial propagation in the chamber to the outer periphery bordered by the cylindrical side wall 51. Coaxial connector 72 attached to the underside of bottom plate 2 has connected a semi-rigid coaxial lead which extends through the passage in the bottom plate coaxial with connector 34 and the center conductor 74 of that lead extends within the chamber and across the gap into a passage or receptacle within the upper surface of the intermediate plate 4 and touches and makes electrical contact therewith.

In service in this combination as a combiner, center lead 74 collects electrical energy which propagates thereto from the outer perphirery, bordered by the outer cylindrical side wall 76 of the chamber, radially inwardly toward the center of the unit. In this combination, connector 72 serves as the output and, hence, transmits a higher level of radiation than is received at the splitters input connector. Hence, the center conductor must be capable of carrying greater electrical current and, thusly, it is of a greater diameter than the center conductor of input connector 34.

Turning to amplifier module 8 on the right hand side of FIG. 5a, reference is made to the semi-rigid input coaxial lead 13 and the semi-rigid output coaxial connector or lead 15 which extend from the bottom of the module. As was earlier illustrated and described in connection with FIG. 4, the coaxial line extends through the passage in upper plate 6 and its outer metal wall may make electrical contact with the passage walls. The extending center conductor 13' extends beyond the edge of the sleeve into the chamber and across the gap and into the hole or receptacle in the opposed surface of plate 4 and makes electrical contact therewith. The center conductor serves as an antenna or pick-up probe. It receives RF energy which is propagated from the center of the splitter to this location. As is apparent to the reader, the remaining amplifier modules have the associated corresponding coaxial line input lead similarly connected to a corresponding opening in the underside plate, one of which is illustrated on the left hand side of the figure.

The outer conductor of coaxial lead 15 extends through the axially aligned passages in both upper plate 6 and intermediate plate 4, terminating at the bottom surface approximately. The central conductor 15' extends beyond the end of the sleeve into the chamber and across the gap formed between the bottom surface of plate 4 and the ridge in plate 2 into the coaxially aligned hole in circular ridge 54 and makes electrical contact with plate 4. This center conductor similarly functions as an antenna or RF probe to emissively couple RF energy from the coaxial lead into the radial wave guide combiner. As is apparent from the illustrations and previous description, the remaining amplifier modules contain a like coaxial output line extending through like passages and a center conductor similarly acting as a probe coupled to the radial wave guide combiner which plates 2 and 4 define.

An enlarged partial section view of FIG. 5 is presented in FIG. 9 to show the structure of probe 15' and the gap. The coaxial transmission line has the space between the outer cylindrical and center conductors filled with a dielectric electrically insulative material 15", such as "teflon".

FIG. 10 illustrates, symbolically, power circuit or distribution board 16. The power circuit board is an annular or washer shaped element. It fits over and is fastened to the annular flange 22 in the space between the outer periphery of fan 20, and the ends of the amplifier modules.

The series of channels and ridges and passages previously described and the radial positional relationship was described with great particularity in FIGS. 6 through 8. By way of specific example using the form of the preferred embodiment, the outer diameter of the plates 2, 4, and 6 was made approximately 21.6 inches. In one specific example of the preferred splitter combiner used in the combination described at the specified UHF range of frequencies, the outer diameter of plates 2, 4, and 6 was 21.65 inches and the exemplary dimensions of the other elements were as follows:

| Element | Spacing | Size - Diameter Inner | Outer |
|---|---|---|---|
| Splitter. | | | |
| Ridge 50 | $d_1 = 0.100$ | — | 1.238 |
| Ridge 54 | $d_2 = 0.186$ | 10.240 | 13.778 |
| Channel 52 | $d_3 = 0.500$ | 1.238 | 10.240 |
| Channel 56 | $d_4 = 0.412$ | 13.778 | 17.320 |
| Combiner. | | | |
| Ridge 60 | $d_5 = 0.125$ | — | 2.336 |
| Ridge 64 | $d_6 = 0.213$ | 7.546 | 13.554 |
| Ridge 68 | $d_7 = 0.100$ | 16.050 | 18.870 |
| Channel 62 | $d_8 = 0.900$ | 2.336 | 7.546 |
| Channel 66 | $d_9 = 0.900$ | 13.554 | 16.050 |
| Channel 69 | $d_{10} = 0.900$ | 18.870 | 20.836 |

The plates forming the splitter and combiner are made from aluminum and are machined to shape. Of course other known metals, such as copper, may be used with appropriate design adjustments. In other respects assembly of the elements into the package is self expanatory from the illustrations an descriptions given and otherwise involve details with which those in the manufacturing art of these kind of devices is readily familiar. For ease of assembly the holes in the upper surface of plate 6, which are to receive the semi-rigid coax leads, have beveled edges. This bevel helps guide the leads into the passage when the amplifier modules are inserted in place during assembly, permitting the amplifier modules to be simply dropped into place and thereafter fastened. It is worthwhile to note that the electrical connections made in this way with the coaxial leads rely simply on contact without the need for firm connective junctions. As applicants have discovered that touching contact is sufficient for a successful result and an improved package, eliminating conventional connectors.

FIG. 11 represents schematically in a schematic diagram the electronics and power connections for the linear amplifier circuit. Thus the RF energy to be amplified is represented as the drive power to the input. The splitter is represented by vertical line S, which divides the drive power between the inputs of the multiple solid state amplifiers; the outputs of those amplifiers are coupled to a combiner, represented by vertical line C, to provide a combined or high level output at P out. Two sources of DC voltage are applied to each of the amplifiers in this case, represented as V1 and V2, specifically as example 26 volts and 5 volts;, and a monitor lead Vmon may extend from each of the amplifiers for connection to appropriate electrical monitoring equipment if desired, which does not form part of the present invention, to monitor the status of each amplifier.

Electrically the linear amplifier assembly, as represented in the schematic, operates in the same manner, essentially, as any other linear amplifier assembly, including those of the prior art. There are always differences which may be found that have not as yet been uncovered. One cannot estimate the full value of improved reliability and tolerance for change under different ambient conditions as the novel assembly demonstrated in practice.

Attention is directed to FIG. 1 and to FIG. 5. With electrical power applied to the fan, the fan operates and draws air through the ducts formed by heat fins 10 of each of the amplifiers. The air conducts heat away from the fins and is drawn by the fans operation to the central location as better viewed in FIG. 5 where it is sucked up and blown out of the unit upward along the axis of the unit. The fans action serves as a cooling device, assisting dissipation of heat generated by amplifier modules 8 through 8t.

RF applied to the input via connector 34, as illustrated in FIG. 5, is coupled through center conductor 35 into the splitter. That RF energy radially propagates through the splitter where it is picked up by probes 13' (and 13'b–13't) associated with the inputs of each of amplifier modules 8 through 8t, effectively dividing the input signal between those inputs, twenty in the specific example given. The signal is processed by the associated amplifier module and is amplified in level. The amplified signal is then coupled out through output coaxial conductor 15 (and 15b–15t, not illustrated) into the power combiner. The signals inputted to the combiner radially propagates toward central conductor 74 associated with connector 72. A similar process occurs which each of the outputs of the substantially identical amplifiers. referred to by the alphabetic letters. As is known in the art, the electrical characteristic of the device, is such that the RF output signals of all of the amplifiers arrive at the combiners central conductor, the combiner output, essentially in phase and so that they combine or sum up to provide a magnified output. The combined output is coupled from the combiners output, via cabling not illustrated, to other electronic equipment which does not form a part of the linear amplifier of this invention and is not described.

In this specification, the term RF is used. The term originally meant "radio frequency", one form of alternating current electricity that has a high frequency used originally for normal radio broadcasts, but that term has come to mean as well all of the other ranges of useful transmission frequencies, such as the very high frequencies, VHF, ultra high frequencies, UHF, the microwave frequencies, ie. frequencies above 1 GHz, and other frequency ranges of electromagnetic energy that possesses the characteristics useful in these kind of devices. The term is thus understood to be a descriptive one in the art and not a term of limitation.

There is a saying that "virtue is its own reward". For the invention, an appropriate paraphrase is that "simplicity is its own reward". In departing from what is believed to be conventional practice with a new arrangement of splitter-combiners, there has resulted a unit that requires less space to install and thus saves money on facilities, eliminates expensive parts, weighs less, provides a structure which can be more easily assembled by personnel with lesser skills and/or training, achieves more effective cooling in applicant's view and is believed to be more tolerant to changes in ambient conditions that otherwise might seriously adversely affect the operation of a linear amplifier. It has been found that the system will continue to operate even if one of the amplifier modules goes out of tolerance or even fails to operate. As those skilled in the art appreciate in devices of simpler structures, there are fewer elements to fail that could cause system failure and, indeed, the simplicity does provide rewards.

In a specific example of a linear amplifier assembly constructed according to the embodiment shown, the amplifier assembly operated in the 870 through 890 MHz. frequency band handling sixteen channels simultaneously at 20 watts per channel and 320 watts average power and 1.2 kilowatts peak power proving the effectiveness of the novel design.

It is believed that the foregoing description of the preferred embodiment of the invention is sufficient in detail to enable one skilled in the art to make and use the invention.

However, it is expressly understood that the details of the elements which are presented for the foregoing enabling purpose is not intended to limit the scope of the invention, in as much as equivalents to hose elements and other modifications thereof, all of which come within the scope of the invention, become apparent to those skilled in the art upon reading this specification. Thus the invention is to be broadly construed within the full scope of the appended claims.

What is claimed is:

1. A linear RF amplifier assembly comprising:
first, second and third metal plate means, said plate means being sandwiched together in overlying and coaxial relationship along a common axis;
said first plate means and said second plate means defining a first chamber therebetween;
said second plate means containing a series of ridges and depressions in the upper surface arranged concentrically coaxially of said axis and located within said first chamber;
said second plate means and said third plate means defining a second chamber therebetween;
said third plate means containing a series of ridges and depressions in the upper surface arranged concentrically coaxially of said axis and located within said second chamber;
said second series of ridges and depressions in said third plate means being different in size and radial position than said series of ridges and depressions in said second plate means;
said first plate means containing a first plurality of passages extending from outside and through said first plate means, said passages opening into said first chamber, said passages being evenly angularly spaced about the axis of said first plate means at a predetermined radial distance therefrom;

said first plate means containing a second plurality of passages, said second plurality of passages extending through said first plate means and through said second plate means and opening into said second chamber, said second plurality of passages being evenly spaced about the surface of said first plate means at a predetermined radial distance from the axis thereof, and said second plurality of passages being equal in number to said first plurality of passages;

each of said first plurality of passages being radially aligned with a corresponding one of said second plurality of passages; first coaxial connector means centrally located in said first plate means, said coaxial connector means having a center conductor extending into said first chamber;

second coaxial connector means centrally located in said third plate means, said second coaxial connector means having a conductor extending into said second chamber;

a plurality of semiconductor amplifier means; said plurality being equal in number to the plurality of first passage means;

each of said amplifier means being supported on the outer surface of said first plate means;

each of said amplifier means containing first and second coaxial lead means;

a first one of said coaxial lead means being of a predetermined first length and having an outer conductor of hollow cylindrical geometry and a center conductor, said center conductor extending a short distance beyond the end of said outer conductor;

a second of said coaxial lead means being of a second predetermined length and having an outer conductor of hollow cylindrical geomentry and a center conductor, said center conductor extending a short distance beyond the end of said outer conductor;

said second coaxial lead means being greater in length than the length of said first coaxial lead means;

said first coaxial lead means being positioned within one of said first passage means with the center conductor extending through said first chamber and being in electrical contact with said second plate means;

and said second coaxial lead means being positioned within the corresponding one of said plurality of second passage means with the center conductor extending through said second chamber and being in electrical contact with said third plate means.

2. The invention as defined in claim 1 wherein each of said amplifier means includes heat fin means, said heat fin means being oriented essentially parallel to the surface of said first plate means and oriented to form inwardly directed air passages; and said invention further comprises:

fan means;

means for supporting said fan means coaxial of said first plate means and at a predetermined distance away from the surface thereof for drawing air through all said heat fin means and exhausting said air coaxially away from said first plate means.

3. The invention as defined in claim 2 further comprising:

printed circuit board means, said printed circuit board means having a washer shaped geometry;

means for supporting said circuit board in between said fan means and an end of all of said plurality of amplifier means;

a plurality of electrical power connector means located on said printed circuit board means, said plurality corresponding in number to said plurality of amplifier means;

electrical power lead means connected to each of said amplifier means, said electrical power lead means containing a connector means and each of said connector means being connected to a corresponding one of the connector means of said printed circuit board means for coupling electrical power from said circuit board means to said amplifier means.

4. The invention as defined in claim 3 wherein said amplifier heat fin means includes: an opening extending through said heat fin means and further comprising: guide post means connected to said first plate means, said guide post means being located in said opening in said heat fin means for holding said amplifier means in place atop said first plate means.

5. The invention as defined in claim 4 wherein said third plate means includes a plurality of receptacle holes and wherein the center conductor of said second coaxial lead means extends into an associated one of said receptacle holes and makes electrical contact with the walls surrounding said receptacle hole.

6. The invention as defined in claim 1 wherein each of said plate means comprises a circular disk shape geometry of a predetermined outer diameter.

7. The invention as defined in claim 4 wherein each of said plate means comprises a circular disk shape geometry of a predetermined outer diameter.

8. The invention as defined in claim 1 wherein said third plate means includes a plurality of receptacle holes axially aligned with a corresponding one of said second passages and wherein the center conductor of said second coaxial lead means extends into an associated one of said receptacle holes and makes electrical contact with the walls surrounding said receptacle hole.

9. The invention as defined in claim 8 wherein said second plate means includes a plurality of receptacle holes axially aligned with a corresponding one of said first passages and wherein the center conductor of said first coaxial lead means extends into an associated one of said receptacle holes and makes electrical contact with the walls surrounding said receptacle hole.

10. An RF power splitter-combiner for use in an amplifier system of the kind requiring both RF power splitting and RF power combining, comprising:

RF splitter means, said splitter means containing a top and bottom wall and splitter input means centrally located therein and a plurality of splitter output means, said plurality of splitter output means being spaced a predetermined radial distance from and evenly angularly spaced about said input means;

RF combiner means, said combiner means having a top and bottom wall and a plurality of input means and an output means, said input means being spaced a predetermined radial distance from and evenly angularly space about said output means;

said splitter means containing an internal chamber and having a plurality of circular ridges and channels located in said splitter chamber concentric of said splitter input means;

said combiner means containing an internal chamber and a plurality of circular ridges and channels located in said combiner chamber concentric of said combiner output means;

said ridges and channels of said combiner means being of a different physical size and axial radial position than said ridges and channels of said splitter means;

said splitter means and said combiner means located in overlying relationship;

said splitter means having one of said splitter means top and bottom walls integral with one of said combiner means top and bottom walls; and said splitter means having a predetermined bandwidth and center frequency characteristic and said combiner means having a predetermined bandwidth and center frequency characteristic, said characteristic of the former being essentially equivalent to said characteristic of the latter.

11. The invention as defined in claim 10 wherein said splitter output means comprises further:

passage means extending from without to within said splitter chamber for permitting extraction of electromagnetic energy from within said splitter means chamber; and wherein said combiner input means comprises further: passage means extending from without and through said splitter means and said common wall opening into said combiner means chamber for permitting electromagnetic energy to be introduced into said combiner means chamber.

12. The invention as defined in claim 10 wherein each of said splitter means and said combiner means comprises a disk shape geometry of a predetermined outer diameter.

13. The invention as defined in claim 11 wherein said splitter means output means further comprises:

coaxial lead means, said coaxial lead means containing a hollow cylindrical outer conductor and a center conductor coaxial therewith electrically insulatedly spaced from said cylindrical conductor, said center conductor extending a predetermined distance beyond the end of said cylindrical outer conductor;

and wherein said coaxial lead means is located within said passage means and having said extended portion of said center conductor extending from the end of the passage through said chamber into contact with the opposed common wall, said outer conductor thereof being located entirely within said passage means and being in electrical contact with the walls defining said passage means.

14. The invention as defined in claim 10 further comprising: attaching means for attaching said amplifier means to said splitter means, whereby said amplifier means is supported on said splitter means.

15. In a linear RF amplifier assembly for amplifying RF signals applied at an input to a higher level signal provided at an output of the type containing radial wave guide splitter means having input means for receiving RF signals to be amplified for splitting said input signal between a first plurality of splitter outputs; a plurality of semiconductor amplifier means, each of said amplifier means for amplifying RF signals applied to an input and applying said amplified signal to an output; each of said amplifier inputs being coupled to a corresponding one of said splitter outputs for coupling RF signals from said splitter means to said amplifier input; radial wave guide combiner means having a plurality of input means and an output means for combining RF signals received at an input and applying said combined signal to said output means, said input means of said combiner means being coupled to corresponding ones of said plurality of amplifier output means for applying said amplifier means outputs to said combiner means, the improvement comprising:

said combiner means and said splitter means being positioned in stacked relationship, one on top of the other, and wherein said combiner means and said splitter means share a metal wall, said wall being integral with each of said combiner and said splitter means; one side surface of said wall being an inside surface of said combiner means and the opposed side surface of said wall being an inside surface of said splitter means.

16. The invention as defined in claim 15 further comprising:

means coupling said combiner input means through openings in said common wall to said amplifier means for coupling RF from said amplifier means to said combiner means; and wherein said plurality of amplifier means is located on the upper surface of said splitter means at positions therealong spaced about the axis of said splitter means.

17. The invention as defined in claim 16 further comprising:

each of said amplifier means having its associated heat fin means forming a grill like passage perpendicular to axis of said splitter means;

fan means, said fan means for direction air in an axial direction of said splitter means;

support means for mounting said fan means to said splitter means; whereby said fan means causes air to flow radially of said upper surface and through said passage formed by said heat fin means.

* * * * *